United States Patent
Kwon et al.

(10) Patent No.: US 9,927,484 B2
(45) Date of Patent: Mar. 27, 2018

(54) RADIO FREQUENCY PROBE APPARATUS

(71) Applicant: ELECTRONICS AND TELECOMMUNICATIONS RESEARCH INSTITUTE, Daejeon (KR)

(72) Inventors: Oh Kee Kwon, Daejeon (KR); Young Tak Han, Daejeon (KR); Ki Soo Kim, Seoul (KR); Su Hwan Oh, Daejeon (KR); Chul Wook Lee, Daejeon (KR); Young Ahn Leem, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/193,667

(22) Filed: Jun. 27, 2016

(65) Prior Publication Data

US 2017/0023635 A1    Jan. 26, 2017

(30) Foreign Application Priority Data

Jul. 20, 2015 (KR) .................. 10-2015-0102358

(51) Int. Cl.
*G01R 31/302* (2006.01)
*G01R 31/265* (2006.01)
(Continued)

(52) U.S. Cl.
CPC ........... *G01R 31/2656* (2013.01); *G01R 1/07* (2013.01); *H01L 22/32* (2013.01); *H01L 23/535* (2013.01); *H01L 23/66* (2013.01); *H01L 24/05* (2013.01); *H01L 24/45* (2013.01); *H01L 2223/6611* (2013.01); *H01L 2223/6627* (2013.01); *H01L 2223/6655* (2013.01); *H01L 2224/04042* (2013.01)

(58) Field of Classification Search
CPC .. G01R 1/0416; G01R 1/067; G01R 1/06711; G01R 1/06744; G01R 1/06772; G01R 1/071; G01R 1/07342; G01R 15/241; G01R 3/00; G01R 31/2601; G01R 31/2886; G01R 31/308; G01R 31/311
See application file for complete search history.

(56) References Cited

U.S. PATENT DOCUMENTS 7,306,484 B1 * 12/2007 Mahoney ............. H01R 24/542
439/578
8,963,559 B2 * 2/2015 Quemerais ............. H03F 1/565
324/614
(Continued)

FOREIGN PATENT DOCUMENTS

KR   10-2001-0081300 A   8/2001
KR   10-2014-0148387 A   12/2014

*Primary Examiner* — Tung X Nguyen
(74) *Attorney, Agent, or Firm* — Rabin & Berdo, P.C.

(57) ABSTRACT

Provided herein is a radio frequency probe apparatus including a RF waveguide including a ground electrode and a signal electrode, a register connected to the signal electrode, a RF connector including an outer conductor connected to the ground electrode, an inner conductor connected to the signal electrode, and a dielectric body filling a portion between the outer conductor and the inner conductor, and a single tip probe connected to the signal electrode of the RF waveguide, or the register.

15 Claims, 6 Drawing Sheets

(51) Int. Cl.
*H01L 21/66* (2006.01)
*H01L 23/66* (2006.01)
*H01L 23/00* (2006.01)
*H01L 23/535* (2006.01)
*G01R 1/07* (2006.01)

(56) References Cited

U.S. PATENT DOCUMENTS

| | | |
|---|---|---|
| 9,250,290 B2 | 2/2016 | Namburi et al. |
| 2011/0248739 A1 | 10/2011 | Kim et al. |
| 2014/0167806 A1 | 6/2014 | Ju et al. |
| 2015/0364830 A1* | 12/2015 | Tong ............... H01Q 19/10 342/27 |

* cited by examiner

RADIO FREQUENCY PROBE APPARATUS

CROSS-REFERENCE TO RELATED APPLICATION

The present application claims priority to Korean patent application number 10-2015-0102358, filed on Jul. 20, 2015, the entire disclosure of which is incorporated herein in its entirety by reference.

BACKGROUND

Field of Invention

Various embodiments of the present disclosure relate to a radio frequency (RF) probe apparatus, and more particularly to, a radio frequency probe apparatus for testing a laser diode.

Description of Related Art

A laser diode (LD) has a semiconductor junction structure of a p-i-n configuration. The laser diode includes an upper electrode and a lower electrode connected to the semiconductor junction structure and operates when a forward bias is applied to the upper electrode and the lower electrode.

In order to test a direct current (DC) state, etc., a bias may be applied to the laser diode. A probe apparatus may be used to apply the bias to the laser diode. The probe apparatus may be formed in a single tip probe structure. When using a conventional single tip probe structure, the bias may be applied to the laser diode by contacting the single tip probe structure to the upper electrode formed on a top of the laser diode after placing a bottom end of the laser diode on a bench was grounded. When applying a high-speed modulation signal of GHz or Gbps or more to the conventional single tip probe structure, loss of signals is increased.

A sufficient bandwidth should be guaranteed in an electrical path connected from a signal generator to the laser diode so as to apply the high-speed modulation signal to the laser diode with a low loss. An electrical signal generated in a typical signal generator may be transmitted to an end region of a RF cable through a high-speed RF cable. The end region of the RF cable may be connected to a RF probe through a connector in order to apply the high-speed modulation signal applied to the RF cable to the laser diode.

Figure 1A:
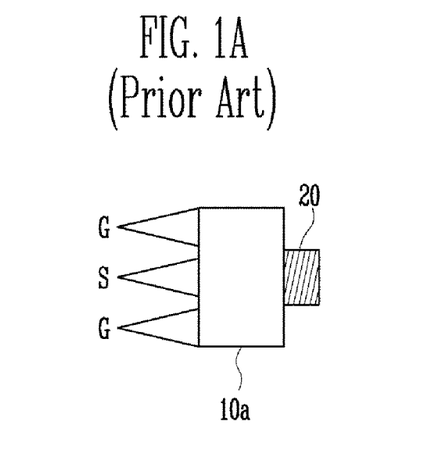
FIGS. 1A to 1C are views for explaining a conventional RF probe structure.
Figure 1B:
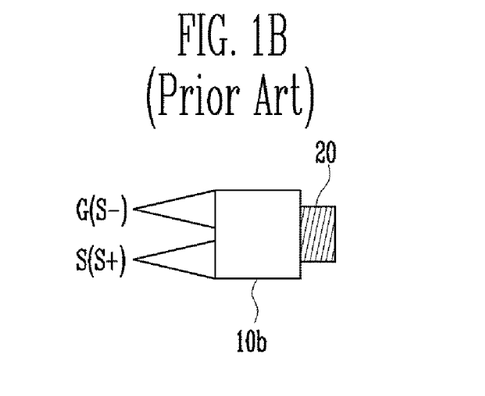
Figure 1C:
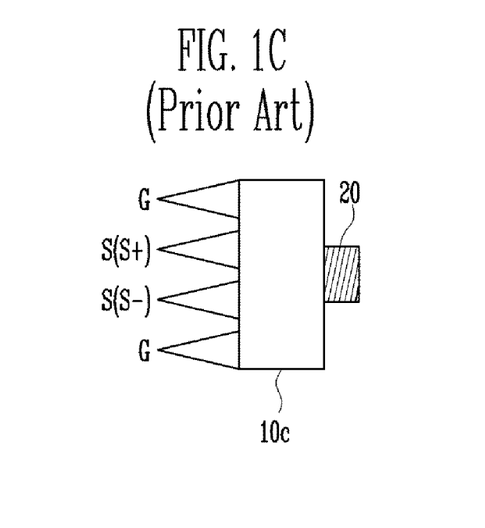

FIGS. 1A to 1C are views illustrating a conventional RF probe structure.

Referring to FIG. 1A to FIG. 1C, a RF probe (10*a*, 10*b* or 10*c*) is connected to a connector 20 and a high-speed modulation signal may be applied.

As shown in FIG. 1A, a RF probe 10*a* may include tips disposed in a structure of GSG (ground, signal and ground). As shown in FIG. 1B, a RF probe 10*b* may include tips disposed in a structure of GS (ground and signal). As shown in FIG. 1C a RF probe 10*c* may include tips disposed in a structure of GSSG (ground, signal+, signal−, ground).

In order to test characteristic of the laser diode by using the RF probe (10*a*, 10*b* or 10*c*) including the structure illustrated in FIGS. 1A to 1C, tips of the RF probe (10*a*, 10*b* or 10*c*) may be contacted to the laser diode. The high-speed modulation signal may be applied to the laser diode through the tips of the RF probe (10*a*, 10*b* or 10*c*).

The laser diode may include pads contacted to the tips of the RF probes (10*a*, 10*b* or 10*c*). The pads are electrically connected to the upper electrode and the lower electrode of the laser diode. To be contacted to the tips of the RF probes (10*a*, 10*b* or 10*c*), the pads are disposed on an upper portion of the laser diode and exposed. Due to the above, a separate structure is required to connect the lower electrode disposed in a lower portion of the laser diode and the pads disposed on an upper portion of the laser diode.

The high-speed modulation signal supplied from the signal generator may be applied to the laser diode via the RF cable including specific impedance (e.g., 50 ohm). In general, due to a series resistance (e.g., 5 ohm) of the laser diode, impedance mismatch from the signal generator may occur. The impedance mismatch may cause a large reflected wave, such that a correct signal may be not applied to the laser diode for evaluating characteristic.

SUMMARY

A purpose of the present disclosure is to a radio frequency probe apparatus easy to measure high-speed modulation characteristic of a laser diode, and capable of controlling impedance.

An embodiment of the present disclosure provides a radio frequency probe apparatus including a RF waveguide including a ground electrode and a signal electrode, a register connected to the signal electrode, a RF connector including an outer conductor connected to the ground electrode, an inner conductor connected to the signal electrode, and a dielectric body filling a portion between the outer conductor and the inner conductor, and a single tip probe connected to the signal electrode of the RF waveguide, or the register.

The RF waveguide may include a metal substrate, the ground electrode contacted to and formed on the metal substrate, a dielectric layer formed on the ground electrode, the signal electrode formed on the dielectric layer, and a protective layer covering a portion of the signal electrode and including openings exposing both ends of the signal electrode.

The register may be formed in a surface mountable apparatus (SMD) type including a first terminal connected to the signal electrode and a second terminal connected to the signal tip probe, and mounted on the metal substrate.

The radio frequency probe apparatus may further include a bonding wire connecting the first terminal to the signal electrode, and fixed to the first terminal and the signal electrode by a solder.

The single tip probe may be fixed to the second terminal by a solder.

The radio frequency probe apparatus may further include an insulating substrate supporting a side portion of the register and a side portion of the metal substrate, and penetrated by an inserting hole at which the single tip probe is inserted.

The radio frequency probe apparatus may further include a bonding wire connected between the second terminal and the single tip probe, and fixed by a solder.

The radio frequency probe apparatus may further include auxiliary electrodes formed on the dielectric layer with the signal electrode interposed therebetween and contact plugs penetrating the dielectric layer and connecting the auxiliary electrodes to the ground electrode.

The radio frequency probe apparatus may further include a bonding wire connected between a partial region of the auxiliary electrodes opened by the protective layer and the metal substrate, and fixed to the auxiliary electrode and the metal substrate by a solder.

The RF waveguide may include a metal substrate, a dielectric layer formed on the metal substrate, the ground electrode formed on the dielectric layer, the signal electrodes formed on the dielectric layer and spaced apart from each other, a ground pad formed on an upper portion of the ground electrode to be contacted to the ground electrode, and a signal pad formed on an upper portion of one of the signal electrodes to be contacted to one of the signal electrodes.

The register may be formed in a surface mountable apparatus (SMD) type including a first terminal and a second terminal connected to the signal electrodes, respectively, and connects the signal electrodes.

The radio frequency probe apparatus may further include a bonding wire connecting the ground pad with the metal substrate and fixed to the ground pad and the metal substrate by a solder.

The radio frequency probe apparatus may further include a bonding wire connecting the signal pad with the single tip probe, and fixed by a solder.

The radio frequency probe apparatus may further include an insulating substrate supporting a side portion of the metal substrate and penetrated by an inserting hole at which the single tip probe is inserted.

The RF waveguide may be formed in a PCB type.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawings, sizes or thicknesses of films may be exaggerated for clarity.

Figure 2A:
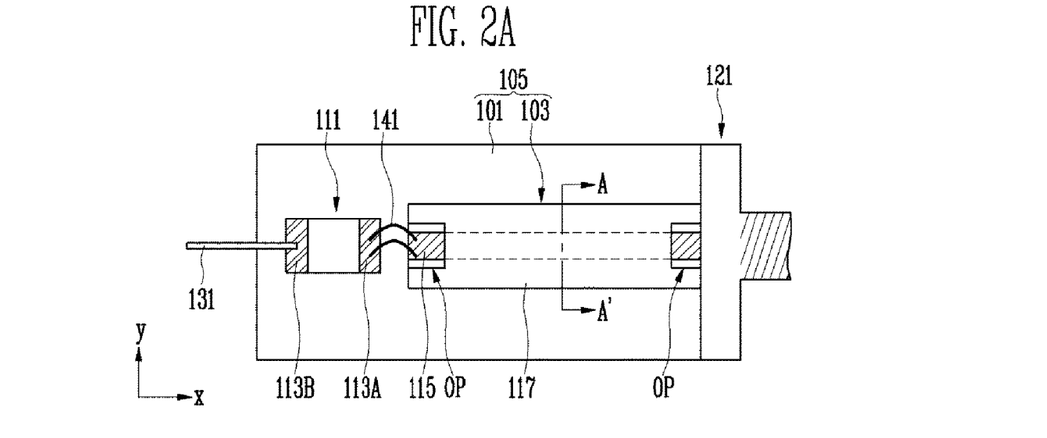
FIGS. 2A to 2C are views for explaining a RF probe structure according to the embodiment of the present disclosure.
Figure 2B:
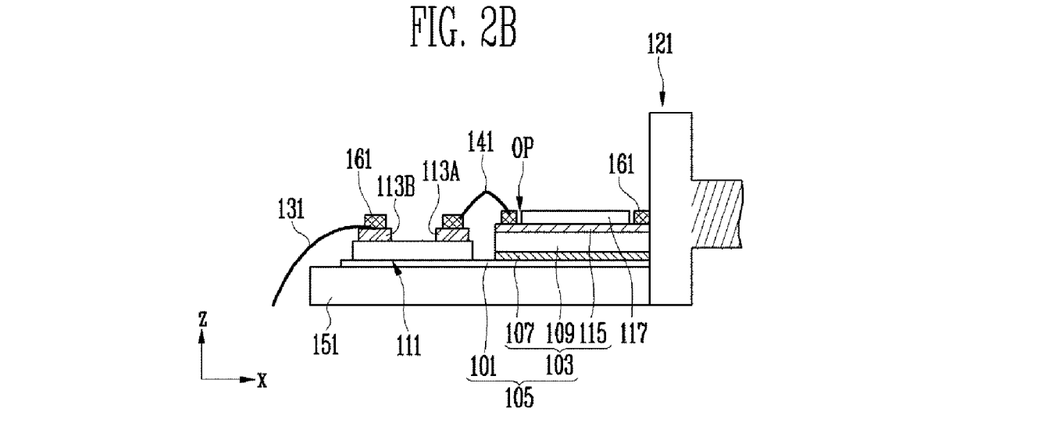
Figure 2C:
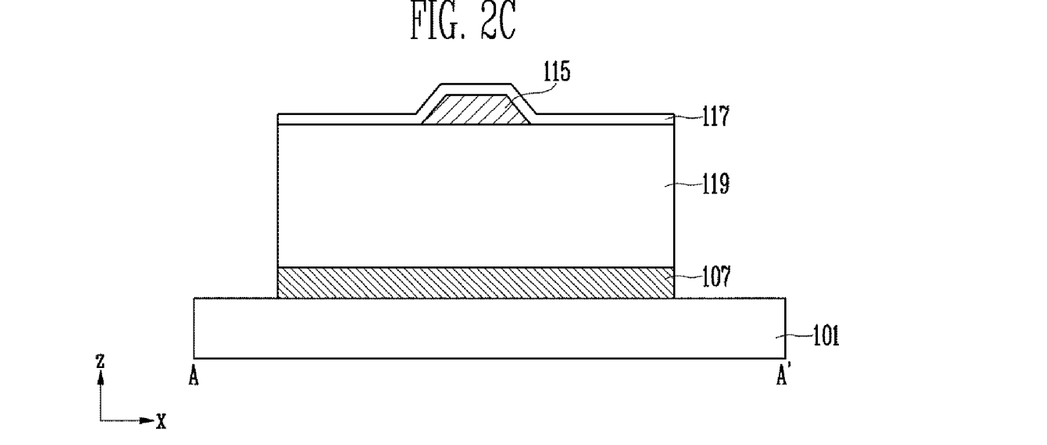

FIGS. 2A to 2C are views for explaining a RF probe structure according to the embodiment of the present disclosure. More specifically, FIG. 2A is a top view of the RF probe apparatus in accordance with an embodiment of the present invention. FIG. 2B is a side view of the RF probe apparatus shown in FIG. 2A. FIG. 2C is a sectional view taken on the line "A-A'" illustrated in FIG. 2A.

Referring to FIG. 2A to FIG. 2C, the RF probe apparatus may include a RF waveguide 105, a register 111, a RF connector 121, and a single tip probe 131.

The RF waveguide 105 may be a PCB (printed circuit board) type. When the RF waveguide 105 is formed of the PCB, loss of the high-speed modulation signal may be reduced. The RF waveguide 105 may include a metal substrate 101 and a circuit pattern 103 formed on the metal substrate 101, and a protective film 117 covering the circuit pattern 103.

The circuit pattern 103 may include a ground electrode 107 formed on an upper portion of the metal substrate 101 to be contacted to the metal substrate 101, a dielectric layer 109 formed on the ground electrode 107, and a signal electrode 115 formed on the dielectric layer 109. The ground electrode 107 and the signal electrode 115 may be formed of a particular type of pattern, for example, formed in a micro-stripe line. The ground electrode 107 and the signal electrode 115 may be formed of a conductive material such as copper.

The protective layer 117 may include openings OP exposing both ends of the signal electrode 115. Both ends of the signal electrode 115 exposed through the openings OP may be used as a connecting region for an electrical connection.

The register 111 may be formed in a surface mountable apparatus (SMD) type. In this case, the register 111 having various impedances may be easily connected to the RF waveguide 105 in a PCB type. The impedance of the resistor 111 may be selected in consideration of an impedance of the RF waveguide 105 and an impedance of the laser diode to be measured. For example, when the impedance of the RF waveguide 105 is 50 (ohm), and the impedance of the laser diode to be measured is 5 (ohm), the resistor 111 having an impedance of 45 (ohm) may be selected. The register 111 may be connected to the RF waveguide 105 in the PCB-type and control an impedance of the high-speed modulation signal applied to the laser diode. The register 111 may include a first terminal 113A and a second terminal 113B for the electrical connection with another apparatus. The register 111 may be mounted on the metal substrate 101.

The RF connector 121 may be electrically connected to the RF waveguide 105. The RF connector 121 may be connected to the ground electrode 107 of and the signal electrode 115 of the RF waveguide 105. Connecting relations between the RF connector 121 and RF waveguide 105 will be described below with reference to FIGS. 5A and 5B. The RF connector 121 may be a K connector or a V connector useful for transmission of the high-speed modulation signal.

The single tip probe 131 may be connected to the laser diode (not shown) to transmit the high-speed modulation signal and have a conductivity. The single tip probe 131 may be bent to be connected to the laser diode to be measured for the characteristic.

The metal substrate 101 may be placed on a jig 151 and connected to the RF connector 121.

The first terminal 113A of the register 111 and the signal electrode 115 of the RF waveguide 105 exposed through the opening OP may be electrically connected to each other via a bonding wire 141. The bonding wire 141 may be fixed to the first terminal 113A and the signal electrode 115 through a connecting member such as a solder 161.

The single tip probe 131 may be electrically connected to the second terminal 113B of the register 111. The single tip probe 131 may be fixed to the second terminal 113B via the connecting member such as the solder 161.

As lengths of the bonding wire 141 and the single tip probe 131 become shorter, an inductance may be minimized.

According to the above-described structure, the high-speed modulation signal applied to the RF connector 121 may be directly transmitted to the laser diode via the PCB-type RF waveguide 105, the register 111, and the single tip probe 131.

Figure 3A:
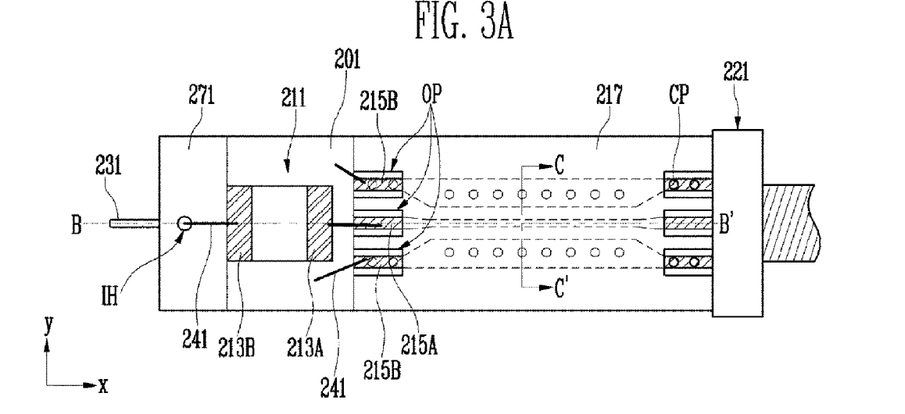
FIGS. 3A to 3C are views for explaining a RF probe structure according to the embodiment of the present disclosure.
Figure 3B:
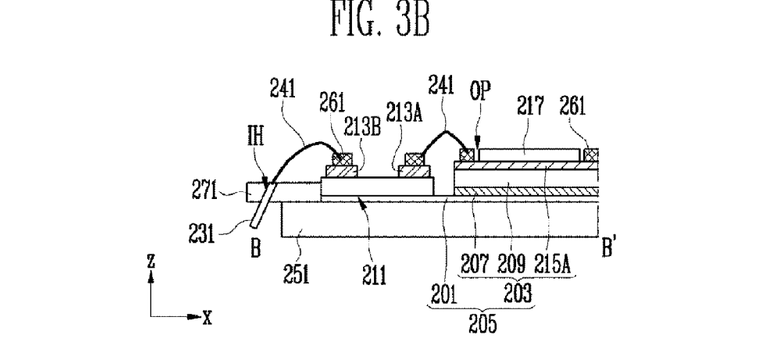
Figure 3C:
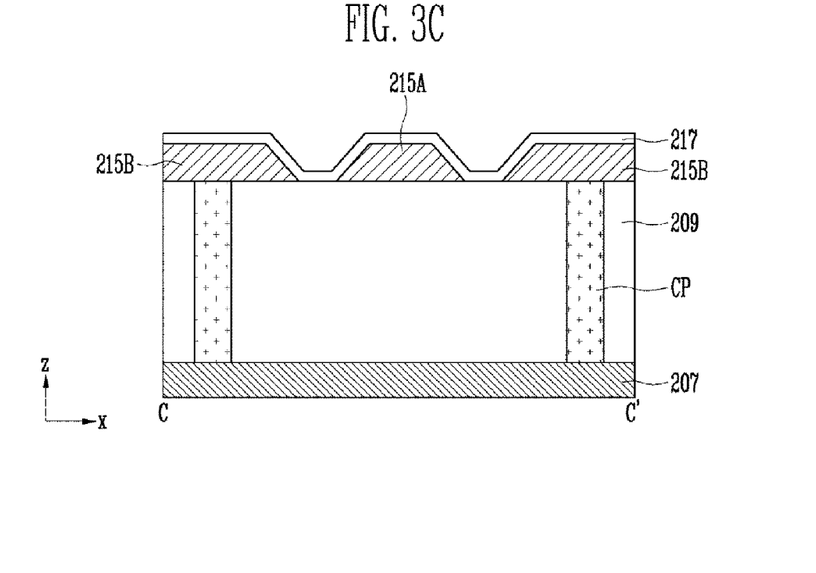

FIGS. 3A to 3C are views for explaining a RF probe structure according to the embodiment of the present disclosure. More specifically, FIG. 3A is a top view of the RF probe apparatus in accordance with an embodiment of the present invention. FIG. 3B is a cross-sectional view of the RF probe apparatus taken along line "B-B'" shown in FIG. 3A. FIG. 3C is a cross-sectional view taken along line "C-C'" shown in FIG. 3A.

Referring to FIGS. 3A to 3C, the RF probe apparatus may include a RF waveguide 205, a register 211, a RF connector 221, a single tip probe 231, and an insulating substrate 271.

The RF waveguide 205 may include a metal substrate 201, a circuit pattern 203 formed on the metal substrate 201, and a protective film 217 covering the circuit pattern 203.

The circuit pattern 203 may be formed of a GCPW (grounded coplanar waveguide) type structure. More specifically, the circuit pattern 203 may include the ground electrode 207 formed on the metal substrate 201 to be contacted to the metal substrate 201, the dielectric layer 209 formed on the ground electrode 207, and upper electrodes 215A and 215B formed on the dielectric layer 209. The upper electrodes 215A and 215B include a signal electrode 215A and auxiliary electrodes 215B with the signal electrode 215A interposed therebetween. The auxiliary electrodes 215B may be connected to the ground electrode 207 through contact plugs CP passing through the dielectric film 209. The contact plug CP may be formed by filling the inside of holes penetrating the dielectric film 209 with a conductive material. Through the circuit pattern 203 of the GCPW structure may implement a stable ground and improved high-speed characteristic.

The ground electrode 207 and the upper electrodes 215A and 215B may be formed in a pattern of a particular type. For example, the ground electrode 207 and the upper electrodes 215A and 215B may be formed in the micro-stripe line structure. The ground electrode 207 and the upper electrodes 215A and 215B may be formed of the conductive material such as copper.

The protective layer 217 may include the openings OP exposing both ends of the upper electrodes 215A and 215B. Both ends of the upper electrodes 215A and 215B exposed through the openings OP may be used as the connecting region for the electrical connection.

The register 211 may be formed in the surface mountable apparatus (SMD) type which is capable of mounting a surface. An impedance of the resistor 211 may be selected in consideration of the impedance of RF waveguide 205 and the impedance of the laser diode to be measured. The register 211 may be connected to the PCB-type RF waveguide 205 and control the impedance of the high-speed modulation signal applied to the laser diode. The register 211 may include a first terminal 213A and a second terminal 213B for the electrical connection with another apparatus. The register 211 may be mounted on the metal substrate 201.

The RF connector 221 may be electrically connected to the RF waveguide 205. The RF connector 221 may be connected to the ground electrode 207 of the RF waveguide 205, the auxiliary electrodes 215B, and the signal electrode 215A. The connecting relation between the RF connector 221 and the RF waveguide 205 will be described below with reference to FIGS. 5A and 5B. The RF connector 221 may be the K connector or the V connector useful for transmission of the high-speed modulation signal.

The single tip probe 231 may be connected to the laser diode (not shown) to transmit the high-speed modulation signal, and have the conductivity. The single tip probe 231 may be inserted into an inserting hole IH formed on the insulating substrate 271 and supported by the insulating substrate 271.

The insulating substrate 271 penetrated by the inserting hole IH may support a side portion of the metal substrate 201 and a side portion of the register 211. The single tip probe 231 supported by the insulating substrate 271 may maintain a structurally stable form in contact with the laser diode, even if pressure is applied.

The metal substrate 201 and the insulating substrate 271 may be placed on the jig 251.

The first terminal 213A of the register 211 and the signal electrode 215A of the RF waveguide 205 exposed through the opening OP may be electrically connected through a bonding wire 241. The bonding wire 241 may be fixed to the first terminal 213A and the signal electrode 215A through the connecting member such as the solder 261.

The metal substrate 201 and the auxiliary electrodes 215B of the RF waveguide 205 exposed through the openings OP may be electrically connected through the bonding wires 241. The bonding wires 241 may be fixed to the metal substrate 201 and the auxiliary electrodes 215B through the connecting member such as the solder 261.

The single tip probe 231 and the second terminal 213B of the resistor 211 may be electrically connected through the bonding wire 241. The single tip probe 231 may be fixed to the single tip probe 231 and the second terminal 213B of the register 211 through the connecting member such as the solder 261.

According to the above-described structure, the high-speed modulation signal applied to the RF connector 221 may be directly transmitted to the laser diode through the PCB-type RF waveguide 205, the register 211, and the single-tip probe 231.

Figure 4A:
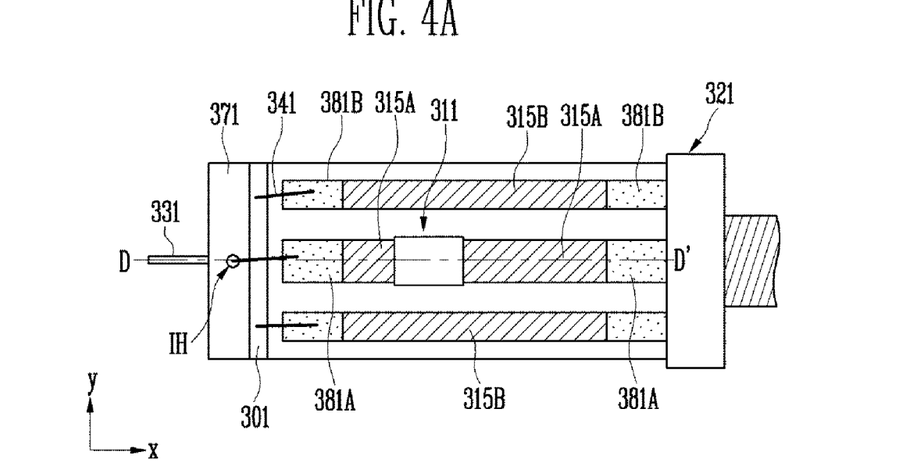
FIGS. 4A and 4B are views for explaining a RF probe structure according to the embodiment of the present disclosure.
Figure 4B:
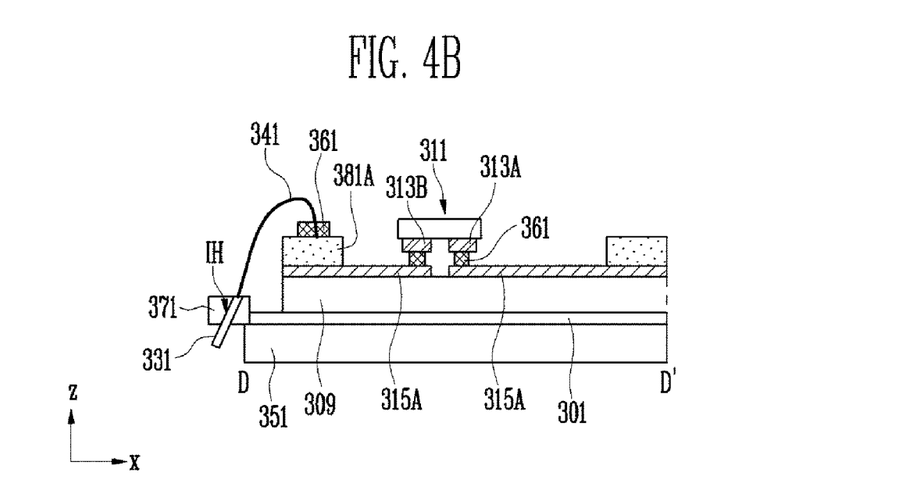

FIGS. 4A and 4B are views for explaining a RF probe structure according to the embodiment of the present disclosure. More particularly, FIG. 4A is a top view of the RF probe apparatus in accordance with an embodiment of the present disclosure. FIG. 4A is a cross-sectional view of the RF probe apparatus taken along line "D-D'" shown in FIG. 4a.

Referring to FIGS. 4A and 4B, the RF probe apparatus may include the RF waveguide, a register 311, a RF connector 321, a single tip probe 331, and an insulating substrate 371.

The RF waveguide may include a metal substrate 301, a dielectric film 309 formed on metal substrate 301, upper electrodes 315A and 315B formed on the dielectric film 309, and pads 381A and 381B formed on the upper electrodes 315A and 315B. The upper electrodes 315A and 315B may include signal electrodes 315A and ground electrodes 315B with the signal electrodes 315A interposed therebetween. The pads 381A and 381B may include a signal pad 381A formed to be contacted to one of the signal electrodes 315A and the ground pads 381B formed to be contacted to the ground electrode 315B. The pads 381A and 381B may be used as a connecting region for the electrical connection.

The upper electrodes 315A and 315B may be formed in a pattern of a particular type, for example, in the micro-stripe line. The signal electrodes 315A may be spaced apart from each other and arranged along each extending direction of the ground electrodes 315B. The signal electrodes 315A spaced apart from each other may be electrically connected via the register 311 to be described below.

The register 311 may be formed in the surface mountable apparatus (SMD) type which is capable of mounting the surface. An impedance of the resistor 311 may be selected in consideration of the impedance of RF waveguide and the impedance of the laser diode to be measured. The register 311 may be connected to the PCB-type RF waveguide and control the impedance of the high-speed modulation signal applied to the laser diode. The register 311 may include a first terminal 313A and a second terminal 313B for the electrical connection with another apparatus. The first and second terminals 313A and 313B of the register 311 may be connected to the signal electrodes 315A spaced apart from each other through the connecting member such as the solder 361.

The RF connector 321 may be electrically connected to the RF waveguide. The RF connector 321 may be connected to the ground electrode 315B and the signal electrode 315A of the RF waveguide. A connecting relation between the RF connector 321 and RF waveguide will be described below with reference to FIGS. 5A and 5B. The RF connector 321 may be a K connector or a V connector useful for transmission of the high-speed modulation signal.

The single tip probe 331 may be connected to the laser diode (not shown) to transmit the high-speed modulation signal and have the conductivity. The single tip probe 331 may be inserted into the inserting hole IH formed on the insulating substrate 371 and supported by the insulating substrate 371.

The insulating substrate 371 penetrated by the inserting hole IH may support a side portion of the metal substrate 301. The single tip probe 331 supported by the insulating substrate 371 may maintain the structurally stable form even through the single tip probe 331 is contacted to the laser diode and the pressure is applied The metal substrate 301 and the insulating substrate 371 may be placed on a jig 351.

The signal pad 381A may be electrically connected to the single tip probe 331 through a bonding wire 341. The bonding wire 341 may be fixed to the signal pad 381A and the single tip probe 331 through the connecting member such as the solder 361.

The metal substrate 301 may be electrically connected to the ground pad 381B through the bonding wire 341. The bonding wire 341 may be fixed to the metal substrate 301 and the ground pad 381B through the connecting member such as the solder 361.

According to the above structure, the high-speed modulation signal applied to the RF connector 321 may be directly transmitted to the laser diode through the PCB-type RF waveguide, the register 311, and the single tip probe 331.

Figure 5A:
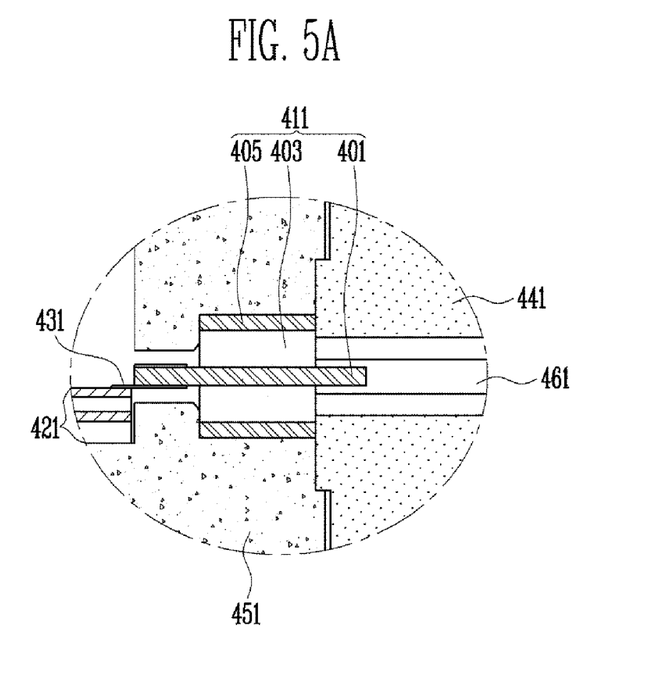
FIGS. 5A and 5B are views for explaining a connecting relation between a RF waveguide and a RF connector according to the another embodiment of the present disclosure.

FIGS. 5A and 5B are views for explaining a connecting relationship between a RF waveguide and a RF connector according to the another embodiment of the present disclosure Referring to FIG. 5A, a RF connector 411 may include an inner conductor 401, a dielectric body 403, and an outer conductor 405. The outer conductor 405 may form an external part of the RF connector 411. The dielectric body 403 and the inner conductor 401 may be housed inside of the outer conductor 405. The dielectric body 403 may be formed surrounding the inner conductor 401. The dielectric body 403 may be glass beads. The inner conductor 401 may be formed longer than the outer conductor 405. The dielectric body 403 may fill a portion between the inner conductor 401 and outer conductor 405, thereby surrounding a portion of the inner conductor 401.

The outer conductor 405 of the RF connector 411 described above may be combined to a RF module 451. The RF module 451 may include a hole with a larger diameter than the inner conductor 401. One end of the inner conductor 401 may be inserted into the inside of the holes of the RF module 451. The inner conductor 401 may be spaced apart from the RF module 451. The RF module 451 may be formed of the conductive material such as copper. The RF module 451 may be formed of a structure that supports a PCB-type RF waveguide 421. The RF waveguide 421 may be formed in the structure described in FIGS. 2A to 2C, the structure described in FIGS. 3A to 3C, or the described structure in FIGS. 4A and 4B.

The metal substrate (101 in FIGS. 2A to 2C, 201 in FIGS. 3A to 3C, or 301 in FIGS. 4A and 4B) of the RF waveguide 421 may be placed to be contacted to the RF module 451. Thus, the outer conductor 405 of the RF connector 411 may be connected to the ground electrode of the RF waveguide 421 via a RF module 451 and the metal substrate.

One end of the inner conductor 401 may be connected to the RF waveguide 421 through a connecting member 431. The connecting member 431 may be a sliding contact or the solder. The inner conductor 401 may be connected to the signal electrode (115 in FIGS. 2A to 2C or 215A in FIGS. 3A to 3C) of the RF waveguide 421 or the signal pad (381A in FIGS. 4A and 4B) of the RF waveguide 421.

The RF module 451 combined to the RF connector 411 may be combined to a flange 441 to be fixed. A RF cable 461 for transmitting and receiving the high-speed modulation signal may be inserted into the flange 441, and the other end of the inner conductor 401 may be connected to the RF cable 461.

According to the structure described above, the high-speed modulation signal transmitted through the RF cable 461 may be applied to the signal electrode of the RF waveguide 421 via the inner conductor 401.

Figure 5B:
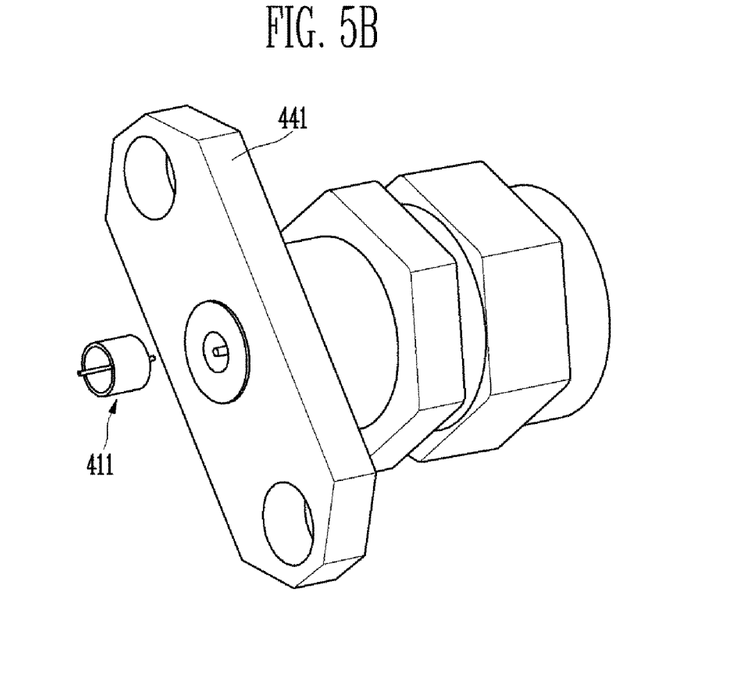

Referring to FIG. 5B, an inserting hole may be formed in the flange 441 in which the inner conductor (401 in FIG. 5A) of the RF connector 411 and the RF cable (461 in FIG. 5A) are inserted.

Figure 6:
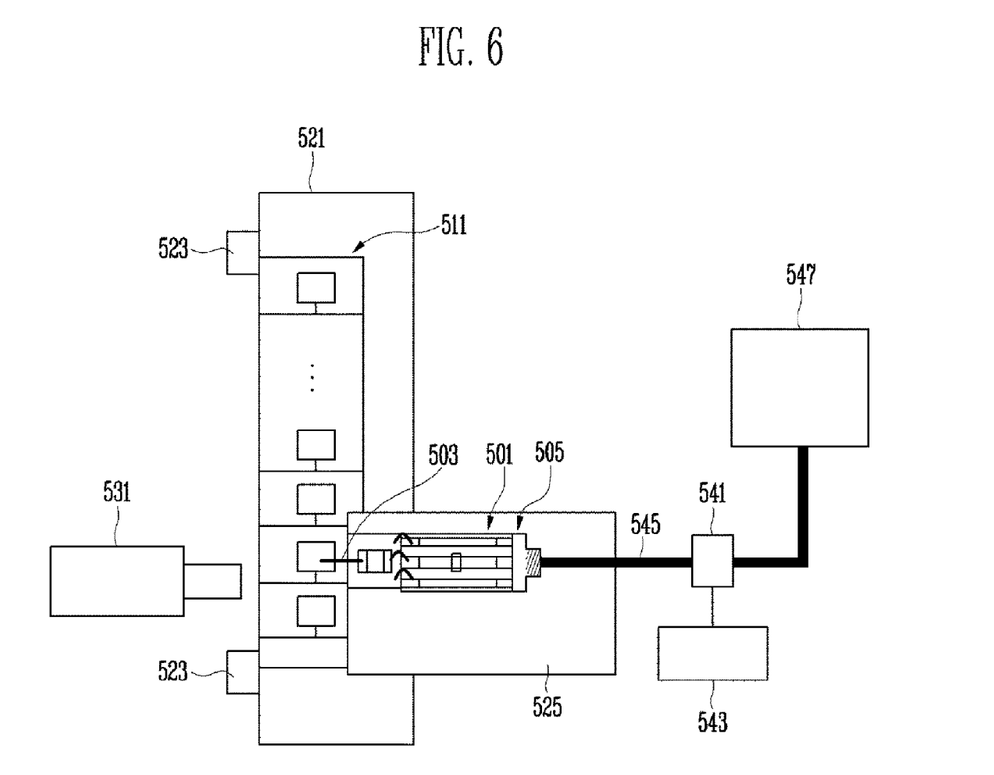
FIG. 6 is view for explaining a laser diode chip bar by using a RF probe apparatus according to another embodiment of the present disclosure.

FIG. 6 is a view for explaining a laser diode chip bar by using a RF probe apparatus according to another embodiment of the present disclosure Referring to FIG. 6, a laser diode chip bar 511 in which laser diodes in a chip state are arranged may be placed on a first stage 521 and fixed by a fixture 523 before packaging the laser diode. The first stage 521 may move up and down and from a left side and to a right side.

A second stage 525 on which a RF probe apparatus 501 according to an embodiment of the present disclosure is fixed may be arranged on the first stage 521. A position of the second stage 525 may be fixed while a test is in progress. The RF probe apparatus 501 fixed to the second stage 525 may be the structure described in FIGS. 2A to 2C, the structure in FIGS. 3A to 3C, or the structure described in FIGS. 4A and 4B. The RF probe apparatus 501 according to an embodiment of the present invention comprises a single tip probe 503 and a RF connector 505 connected to a RF cable 545.

A position of the first stage 521 may be controlled so that the single tip probe 503 is contacted to one of pads of laser diode chips. For example, a test for a first laser diode may be performed by controlling the position of the first stage 521 so that the single tip probe 503 is contacted to the first laser diode of a laser diode chip bar 511. Thereafter, the first stage may be vertically moved to a lower portion so that the first laser diode and the single tip probe 503 are spaced apart from each other, and the first stage 521 may be horizontally moved toward a position at which a second laser diode of a laser diode chip bar 511 is arranged. Subsequently, a test for the second laser diode may be performed after vertically moving the first stage 521 so that the single tip probe 503 is contacted to the second laser diode.

The high-speed modulation signal for measuring the characteristic of the laser diode may be transmitted to the RF connector 505 through a bias-T 541 and the RF cable 545. The bias-T 541 may transmit a bias voltage from a DC bias circuit 543 and high-speed data supplied from a source 547 to the RF connector 505.

A signal supplied to the RF connector 505 may be applied to the laser diode through the single tip probe 503 of the RF probe apparatus 501, and the laser diode may emit light controlled according to the signal supplied through the RF connector 505. Light emitted from the diode laser may be converted into a current through a detector 531 and measure the characteristic of the laser diode.

A RF probe apparatus in accordance with the present invention may apply a high-speed modulation signal applied from a RF cable to a laser diode through a RF connector, a RF waveguide, a register and a single tip probe.

As described above, the RF probe apparatus according to the embodiments of the present invention may apply a high-speed modulation signal applied from the RF cable to the laser diode through the RF connector, the RF waveguide, the register and the single tip probe. Accordingly, without changing the basic structure of the laser diode, by directly connecting the single tip probe to the laser diode, the high-speed modulation signal may be applied to the laser diode. For example, when measuring the characteristic of the laser diode through the RF probe including a multi-tip, a separate structure for connecting lower electrode of the laser diode and pads arranged on a surface for measuring the characteristic of the laser diode is required. For this purpose, the basic structure of the laser diode needs to be changed and it is difficult to reuse the laser diode for measurement with a changed basic structure. Since the present invention may apply the high-speed modulation signal to the laser diode with the single probe tip, without changing the basic structure of the laser diode, in the present invention the laser diode used for measuring the characteristic of the high-speed modulation may be reused.

According to the present invention, through the PCB (printed circuit board) type RF waveguide with low loss of the high-speed modulation signal and the resistor for controlling an impedance, the impedances between the high-speed modulation signal output from the signal generating source and the high-speed modulation signal applied to the laser diode may be matched. Thus, the RF probe apparatus according to the embodiments of the present invention may be used to measure the characteristic of the high-speed operation of the laser diode of the various structures.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A radio frequency probe apparatus, comprising:
    an RF waveguide including a metal substrate, a ground electrode formed on the metal substrate and a signal electrode formed on the metal substrate;
    a register connected to the signal electrode;
    an RF connector including an outer conductor connected to the ground electrode, an inner conductor connected to the signal electrode, and a dielectric body filling a portion between the outer conductor and the inner conductor; and
    a single-tip probe connected to the signal electrode of the RF waveguide, or the register.

2. The radio frequency probe apparatus according to claim 1, wherein the RF waveguide further comprises:
    a dielectric layer formed on the ground electrode; and
    a protective layer covering a portion of the signal electrode and including openings exposing ends of the signal electrode
    wherein the ground electrode contacts the metal substrate, and
    wherein the signal electrode is formed on the dielectric layer.

3. The radio frequency probe apparatus according to claim 2, wherein the register is formed in a surface-mountable apparatus including a first terminal connected to the signal electrode and a second terminal connected to the single-tip probe, and mounted on the metal substrate.

4. The radio frequency probe apparatus according to claim 3, further comprising a bonding wire connecting the first terminal to the signal electrode and fixed to the first terminal and the signal electrode by solder.

5. The radio frequency probe apparatus according to claim 3, wherein the single-tip probe is fixed to the second terminal by solder.

6. The radio frequency probe apparatus according to claim 3, further comprising an insulating substrate supporting a side portion of the register and a side portion of the metal substrate, and penetrated by an inserting hole at which the single-tip probe is inserted.

7. The radio frequency probe apparatus according to claim 6, further comprising a bonding wire connected between the second terminal and the single-tip probe and fixed by solder.

8. The radio frequency probe apparatus according to claim 2, further comprising:
    auxiliary electrodes formed on the dielectric layer with the signal electrode interposed therebetween; and
    contact plugs penetrating the dielectric layer and connecting the auxiliary electrodes to the ground electrode.

9. The radio frequency probe apparatus according to claim 8, further comprising a bonding wire connected between a partial region of the auxiliary electrodes opened by the protective layer and the metal substrate and fixed to the auxiliary electrode and the metal substrate by solder.

10. The radio frequency probe apparatus according to claim 1, wherein the RF waveguide further comprises:
    a dielectric layer formed on the metal substrate;
    another signal electrode formed on the dielectric layer and spaced apart from the signal electrode;
    a ground pad formed on an upper portion of the ground electrode to be contacted to the ground electrode; and
    a signal pad formed on an upper portion of one of the signal electrode or the other signal electrode to be contacted to one of the signal electrode or the other signal electrode, wherein the ground electrode is formed on the dielectric layer, and wherein the signal electrode is formed on the dielectric layer.

11. The radio frequency probe apparatus according to claim 10, wherein the register is formed in a surface-mountable apparatus including a first terminal and a second terminal connected to the signal electrode and the other signal electrode, respectively, and connects the signal electrode and the other signal electrode.

12. The radio frequency probe apparatus according to claim 10, further comprising a bonding wire connecting the ground pad with the metal substrate and fixed to the ground pad and the metal substrate by solder.

13. The radio frequency probe apparatus according to claim 10, further comprising a bonding wire connecting the signal pad with the single-tip probe and fixed by solder.

14. The radio frequency probe apparatus according to claim 10, further comprising an insulating substrate supporting a side portion of the metal substrate and penetrated by an inserting hole at which the single-tip probe is inserted.

15. The radio frequency probe apparatus according to claim 1, wherein the RF waveguide is a PCB type.

* * * * *